(12) United States Patent
Ruijl

(10) Patent No.: US 6,857,195 B2
(45) Date of Patent: Feb. 22, 2005

(54) APPARATUS FOR THE MEASUREMENT OR MACHINING OF AN OBJECT, PROVIDED WITH A DISPLACEMENT STAGE WITH WEDGE-SHAPED GUIDES

(75) Inventor: Theo Anjes Maria Ruijl, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/476,809
(22) PCT Filed: May 6, 2002
(86) PCT No.: PCT/IB02/01578
§ 371 (c)(1), (2), (4) Date: Nov. 4, 2003
(87) PCT Pub. No.: WO02/091436
PCT Pub. Date: Nov. 14, 2002

(65) Prior Publication Data
US 2004/0134083 A1 Jul. 15, 2004

(30) Foreign Application Priority Data
May 9, 2001 (EP) .............................................. 01201684

(51) Int. Cl.[7] .............................................. G01B 5/004
(52) U.S. Cl. .............................. 33/503; 33/568; 33/573; 33/549; 108/147; 108/143
(58) Field of Search .......................... 33/503, 549, 551, 33/568, 573; 108/138, 143, 147, 144.11

(56) References Cited

U.S. PATENT DOCUMENTS

| | | | | |
|---|---|---|---|---|
| 472,712 A | * | 4/1892 | McKenna | 33/568 |
| 3,328,885 A | * | 7/1967 | Frindel | 33/227 |
| 3,572,680 A | * | 3/1971 | Neff | 108/143 |
| 4,193,317 A | * | 3/1980 | Oono et al. | 108/143 |
| 4,589,351 A | * | 5/1986 | Love | 108/144.11 |
| 4,819,339 A | * | 4/1989 | Kunzmann et al. | 33/503 |
| 4,993,673 A | * | 2/1991 | Hirose | 108/143 |
| 5,280,677 A | * | 1/1994 | Kubo et al. | 33/568 |
| 6,260,428 B1 | * | 7/2001 | Clement | 108/147 |
| 6,421,929 B1 | * | 7/2002 | Keefe | 33/549 |
| 6,764,272 B1 | * | 7/2004 | Nuxoll et al. | 33/573 |

OTHER PUBLICATIONS

"Motion Control 1997 Product Catalog", issued by "Micro–Controle, Member of the Newport Group". pp. 2–38 "UZM Series Motorized Vertical translation Stages".

* cited by examiner

Primary Examiner—Diego Gutierrez
Assistant Examiner—Travis Reis (57) ABSTRACT

An apparatus provided with wedge-shaped elements is proposed for the precision positioning of objects 37 to be measured or machined. A wedge-shaped translational body 32 is carried by two bearing wedges 24, 26. In accordance with the invention the wedges can be independently translated in the x direction. The body is translated in the z direction by moving the bearing wedges over an equal distance but in opposite directions. The body is translated in the y direction by moving the bearing wedges over an equal distance in the same direction. The mutually moving parts of the apparatus are carried by means of fluid bearings. A high precision is thus obtained, because fewer errors due to non-infinite stiffnesses and error motions are accumulated. A laser measuring apparatus 74, 38, 40 is used for measuring and adjusting the position of the object carrier 35.

7 Claims, 6 Drawing Sheets

APPARATUS FOR THE MEASUREMENT OR MACHINING OF AN OBJECT, PROVIDED WITH A DISPLACEMENT STAGE WITH WEDGE-SHAPED GUIDES

The invention relates to an apparatus for the measurement or machining of an object, which apparatus is provided with a displacement stage for the translatory displacement in at least one co-ordinate direction of a part of the apparatus which is to be displaced relative to a frame of the apparatus, which displacement stage includes:

two supporting wedge-shaped displacement guides which bear on a supporting surface of the apparatus and each of which is provided with a wedge face, said guides being arranged opposite one another in such a manner that their wedge faces face one another, a displacement member which is connected to the part of the apparatus to be displaced and is provided with two wedge faces which co-operate with the wedge faces of the displacement guides, the displacement member being supported by the wedge faces of the displacement guides as a result of said co-operation, which apparatus is also provided with drive means for the displacement of the two displacement guides in such a manner that the distance between their wedge faces varies while the orientation of said wedge faces relative to one another remains the same.

Apparatus of this kind can be used, for example, in component-mounting machines, in wafer steppers for the manufacture of integrated circuits, in printers or in co-ordinate measuring machines for determining the shape of an object to be measured. The part of the apparatus which is to be displaced relative to a frame of the apparatus will generally be an object carrier for an object to be machined or measured by means of the apparatus. However, it is alternatively possible for this object to occupy a fixed position relative to the apparatus during the measurement or machining operation; in that case the part of the apparatus to be displaced is a measuring probe or a machining tool such as, for example, a cutter.

A displacement stage for use in an apparatus of this kind is known from "Motion Control 1997 Product Catalog", issued by "Micro-Controle, Member of the Newport Group". The displacement stages described in the cited document, notably on the pages 2 to 38, are referred to therein as "UZM Series Motorized Vertical Translation Stages". The two wedge faces of the two supporting displacement guides in this known displacement stage together form a trough having a V-shaped cross-section. The displacement member is arranged in said trough while the wedge faces of the displacement member bear on the wedge faces of the displacement guides. The displacement member is thus supported by the wedge faces of the displacement guides. In order to displace the displacement member in one co-ordinate direction in this known displacement stage (for example, in the vertical direction), the displacement guides are displaced relative to one another in the horizontal direction by means of drive means in the form of a lead screw. Because the displacement of the two displacement guides is such that the distance between their wedge faces varies while the orientation of these wedge faces relative to one another remains the same, the V-shaped trough becomes wider or narrower without the orientation of the trough being changed. One way to prevent the displacement member from undergoing also an undesirable displacement in a direction transversely of the desired direction, one displacement guide should be subject to a displacement which is equal to but opposed to that of the other displacement guide. Another way is to guide the assembly formed by the displacement guides and the displacement member in a housing.

In the technical field concerning apparatus for the measurement or machining of an object, notably apparatus of this kind for precision displacement, there is often a need for a controlled displacement in more than one co-ordinate direction. When the known displacement stage is used, the desired effect can be achieved by stacking a plurality of stages in such a manner that each stage of the stack provides a displacement in a respective co-ordinate direction transversely of the other two. Thus, an x displacement, a y displacement and a z displacement can be realized by using three stages, it being possible to impart an individual magnitude to each of the three displacements, that is, independently of that of each of the other displacements.

However, said stacking of the displacement stages results in a construction in which the positional uncertainty of a part of the apparatus supported by such a stack increases. Such positional uncertainty is caused inter alia by an accumulation of positional uncertainties which are due to the non-infinite stiffness of each of the displacement stages of the stack, and by an accumulation of the geometrical deviations of the components in the displacement stages. Moreover, the dimensions of such a stack are comparatively large and it is also necessary to displace drive means such as motors, so that forces arise due to supply cables and additional mass must be displaced.

It is an object of the invention to provide an apparatus of the kind set forth in which the cumulation of positional uncertainties due to non-infinite stiffnesses is strongly reduced and a comparatively compact construction is possible.

To this end, the apparatus in accordance with the invention is characterized in that it is provided with control means for controlling the drive means, and that the drive means and the control means are arranged for mutually independent displacement of the two displacement guides. Because the displacement guides are displaceable independently, a mutually equal but opposed displacement can be imparted thereto, like in the known displacement stage. Consequently, the V-shaped trough formed by the displacement member becomes wider or narrower, however, without the center of the trough being displaced. Consequently, the displacement member resting in the trough moves in known manner, that is, perpendicularly to the displacement direction of the displacement guides, for example, in the z direction. However, utilizing the independent motion in accordance with the invention, it is also possible to impart a mutually unequal and opposed displacement to the displacement guides. For example, the same displacement in the same direction can be imparted to the guides; in that case the displacement member moves in a direction perpendicular to the former direction, for example, the x direction. Using an arbitrarily chosen combination of displacements of the displacement guides, any desired displacement can thus be realized in the z direction as well as the x direction, without stacking of displacement guides and hence without the associated accumulation of positional uncertainties.

In a preferred embodiment of the invention the wedge faces of the displacement member bear on the wedge faces of the displacement guides by way of fluid bearings. Bearings of this kind, constructed mainly as air bearings, are generally known. It is a known property of such bearings that their bearing stiffness can be made very high. Another known property is that they exhibit only minor rotational and/or translational error motions. Their use in a precision apparatus in accordance with the invention offers the advantage that the positional uncertainty of the part of the apparatus to be displaced can be significantly reduced by the non-infinite stiffness of the bearing of the displacement member on the displacement guides, and that only minor errors occur in the guiding of the motion.

In another embodiment of the invention the displacement guides bear on the supporting surface of the apparatus by way of fluid bearings. This again offers the advantage that the positional uncertainty of the part of the apparatus to be displaced can be significantly reduced by the non-infinite stiffness of the bearing of the displacement guides on the supporting surface of the apparatus, and that only minor errors occur in the guiding of the motion.

In another embodiment yet of the invention the displacement guides are displaceable across the supporting surface of the apparatus along linear guides which are provided on the supporting surface, the displacement guides bearing on the linear guides by way of fluid bearings. This again offers the advantage that the positional uncertainty of the part of the apparatus to be displaced can be significantly reduced because of the non-infinite stiffness of the bearing of the displacement guides on the linear guides, and that only minor errors occur in the guiding of the motion.

In another embodiment yet of the invention the displacement member is displaceable, relative to the displacement guides, in the direction of the line of intersection of its wedge faces, the apparatus being provided with a drive member which contacts the displacement member in order to drive said displacement, the contact between the displacement member and the drive member being realized by way of a fluid bearing. Said displaceability of the displacement member in the direction of the line of intersection can be readily achieved by way of the fluid bearing between the wedge faces of the displacement member and the displacement guides. This is because a bearing of this kind enables mutual displacement of the two faces in two mutually perpendicular directions. In the case of a fixed attachment of the drive member to the displacement member, the drive member for driving the displacement member would have to move along in directions transversely of its drive direction, thus giving rise to undesirable forces between the two components. Using a fluid bearing between the two components it is achieved that the drive member can exert a force exclusively in the direction of said line of intersection, irrespective of the lateral position of the displacement member.

The part of the apparatus to be displaced in a further embodiment of the invention is provided with at least one mirror surface, the displacement in at least one co-ordinate direction being measured by means of a laser distance sensor which comprises said mirror surface. For the precision of the determination of the position of the object to be measured or machined it is important to avoid sources of positional uncertainty as much as possible. This means that it is advantageous to determine the position of the part of the apparatus to be displaced itself instead of, for example, that of the displacement guides. Therefore, the mirror which forms part of the laser distance sensor is provided on the part of the apparatus to be displaced itself. When use is made of a precision apparatus, not only the required precision is of importance, but also the maximum dimensions of the object to be measured, so the measuring range of the apparatus. In conformity with the invention, a measuring range of 100 mm can be realized quite well. For suitable measurement of the positional precision to be achieved by the part of the apparatus to be displaced in the case of such a measuring range (that is, to avoid the introduction of substantial additional uncertainties by the measurement itself), a laser distance sensor is chosen for the determination of the displacement.

The invention will be described in detail hereinafter with reference to the Figures in which corresponding elements are denoted by corresponding reference numerals. Therein.

Figure 1:
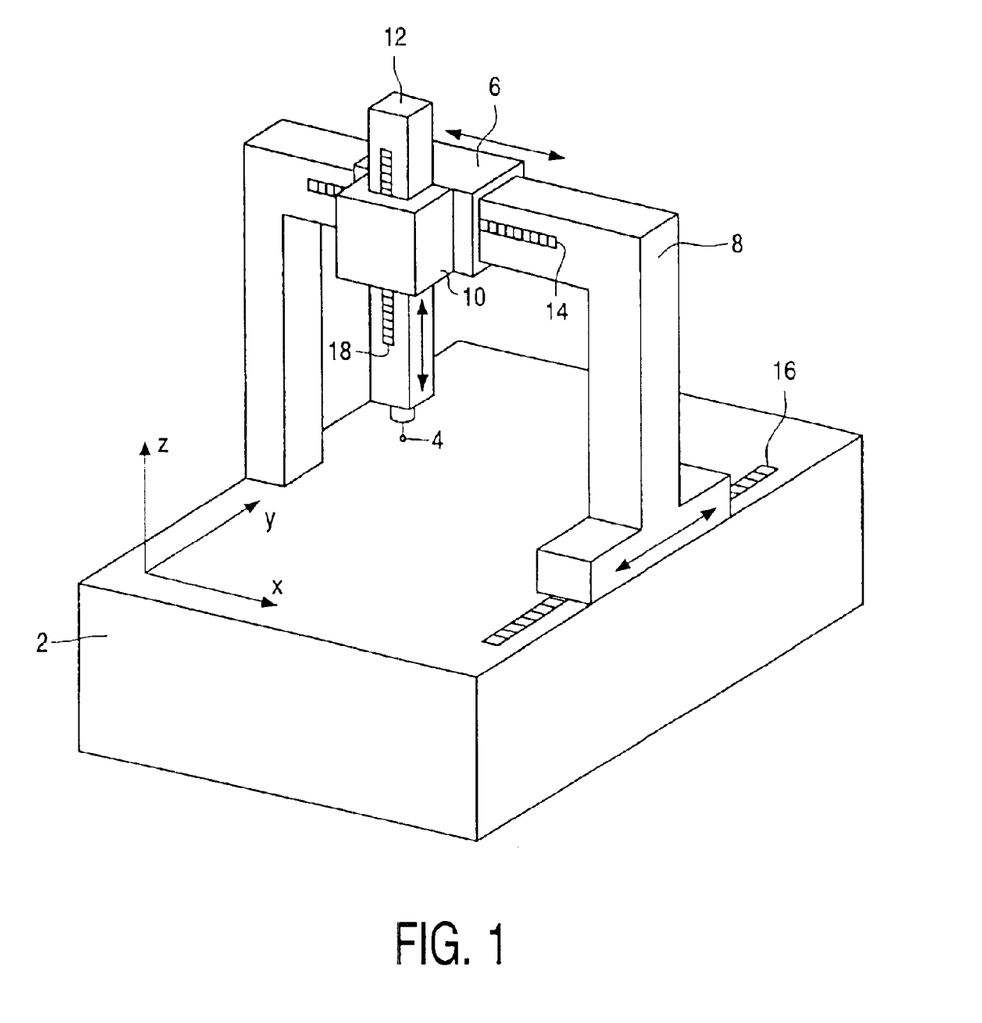
FIG. 1 illustrates diagrammatically the principle of a displacement stage according to the state of the art.

FIG. 1 shows an apparatus for the measurement or machining of an object as generally known from the state of the art. The apparatus includes a frame 2 in the form of a base plate. It is assumed that the apparatus shown in FIG. 1 is arranged for the measurement of an object. The object to be measured can be positioned on the base plate 2, the shape and/or the dimension of the object being determined by scanning by means of a measuring probe 4. Generally speaking, the object can be displaced relative to the measuring probe which is rigidly arranged relative to the apparatus, or the measuring probe can be displaced relative to the object which is rigidly arranged relative to the apparatus. FIG. 1 refers to the latter situation. The part of the apparatus to be displaced relative to the frame 2 of the apparatus, therefore, is the measuring probe 4 in the present case. The measuring probe is displaceable in three mutually perpendicular co-ordinate directions x, y and z, said displacements being realized by an assembly of three mutually independent displacement stages 6, 8 and 10 for displacement in the x direction, the y direction and the z direction. In order to determine the position of the measuring probe, there are provided three optical rulers 14, 16 and 18 for the x direction, the y direction and the z direction, respectively. The measuring probe 4 is attached to a displacement member 12. In order to realize the desired displacements of the respective displacement stages, there may be provided (not shown) drive means for the displacement of the stages, for example, linear motors. The position of the measuring probe 4 is determined by the sum of the positions of the individual stages 6, 8 and 10. Because of this addition of the positions of the stages, however, the positional uncertainty of the measuring probe 4 is also formed by the sum of the positional uncertainties which are due to the non-infinite stiffness of each of the stages 6, 8 and 10 of the assembly, and by addition of the geometrical errors of the components n each of the stages. Moreover, such an assembly has comparatively large dimensions as is illustrated, for example, by the dimensions of the z stage (and note that the displacement range of this stage must still be added thereto).

FIG. 2 is a diagrammatic representation of relevant elements of the displacement stage in accordance with the invention. FIG. 2a is a diagrammatic front view of the apparatus in accordance, with the invention with the displacement stage and the measuring probe. The apparatus as shown in FIG. 2a includes a frame 2 which comprises a supporting surface 20 and a carrier 22 for the measuring probe 4. On the supporting surface 20 there are arranged two wedge-shaped supporting displacement guides 24 and 26, each of which is provided with a wedge face 28 and 30, respectively, in such a manner that these wedge faces are oppositely arranged so as to face one another. A displacement member 32 is arranged between the displacement guides 24 and 26; this member is provided with two wedge faces 34 and 36 which co-operate with the wedge faces 28 and 30, respectively, of the displacement guides 24 and 26, respectively. This co-operation ensures that the displacement member 32 is supported by the wedge faces 28 and 30 of the displacement guides 24 and 26.

Figure 2A:
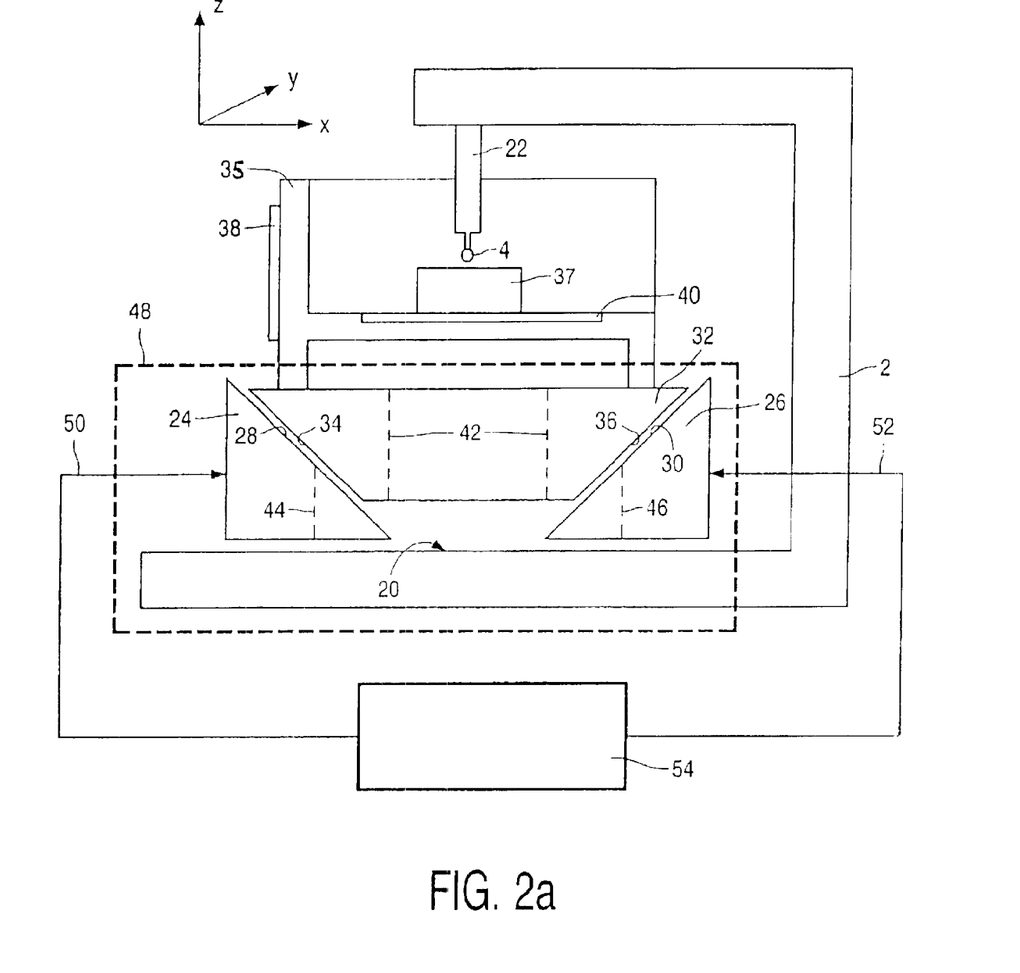
FIG. 2a shows diagrammatically the construction of a measuring or machining apparatus in accordance with the invention.

On the displacement member 32 there is mounted an object carrier 35 for carrying an object 37 to be measured by means of the apparatus. The object carrier 35 is configured as three mutually perpendicularly extending surfaces, each of the outer sides of which is provided with a mirror for determining the position of the object carrier 35 by means of a laser distance sensor (not shown in the Figure); only two of said three mirrors are shown, that is, the mirrors 38 and 40. The displacement member 32 is provided with a comparatively large opening 42 for the passage of the laser beam which measures the z position. Each of the displacement guides 24 and 26 is also provided with an opening 44 and 46, respectively, for the passage of said laser beam; these openings have comparatively small dimensions as will be described in detail with reference to FIG. 2c. The assembly formed by the displacement guides 24 and 26 and the displacement member 32 and the supporting surface 20 constitutes the displacement stage 48. In the present embodiment the part of the apparatus to be displaced is formed by the combination of the displacement member 32 and the object carrier 35.

For the displacement of the displacement guides 24 and 26 there are provided drive means which are not further specified and are diagrammatically represented by arrows 50 and 52 in the Figure. Such drive means may have any appropriate form, for example, a linear electric motor or a hydraulic drive. The drive means 50 and 52 are mutually independent, i.e. the displacement in the x direction of the displacement guide 24 can take place irrespective of the position of the displacement guide 26 and vice versa. Because of the choice of the wedge shape for the displacement guides 24 and 26, the distance between their wedge faces 28 and 30 can vary during their displacement across the supporting surface 20 in the x direction while the orientation of said wedge faces relative to one another remains the same. The drive means 50 and 52 can be controlled in any suitable way; preferably, driving takes place under the control of a suitably programmed computer 54.

The displacement guides 24 and 26 are journaled on the supporting surface 20 by means of known fluid bearings. The displacement member 32 bears on the wedge surfaces 28 and 30 also by means of fluid bearings. Bearings of this kind will be described in brief with reference to FIG. 2d.

When the displacement guides 24 and 26 are driven in accordance with the invention, a displacement of the displacement member 32 can be realized in the z direction as well as in the x direction. For the former displacement the driving of the displacement guides 24 and 26 is controlled in such a manner that they perform an equally large but opposed displacement, for example, towards one another. As a result, the displacement member 32 is displaced in the positive z direction. For the latter displacement the driving of the displacement guides 24 and 26 is controlled in such a manner that they perform an equally large displacement in the same direction, for example, in the positive x direction. As a result, the displacement member 32 is displaced in the positive x direction. Evidently, any combination of the former and the latter displacement is feasible.

Figure 2B:
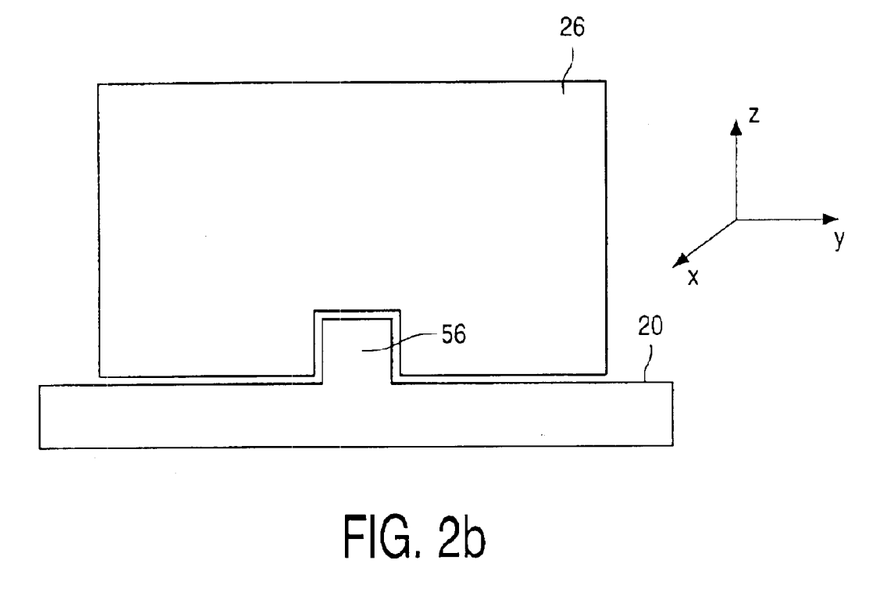
FIG. 2b is a side elevation of a wedge-shaped displacement guide with its linear guide in accordance with the invention.

FIG. 2b is a side elevation of one of the displacement guides, for example, the guide 26. This Figure shows how the displacement of this component is realized in the x direction. A linear guide 56, having a rectangular cross-section, is provided on the supporting surface 20 and a corresponding recess is provided in the displacement guide 26. The displacement guide bears on the linear guide by way of fluid bearings.

Figure 2C:
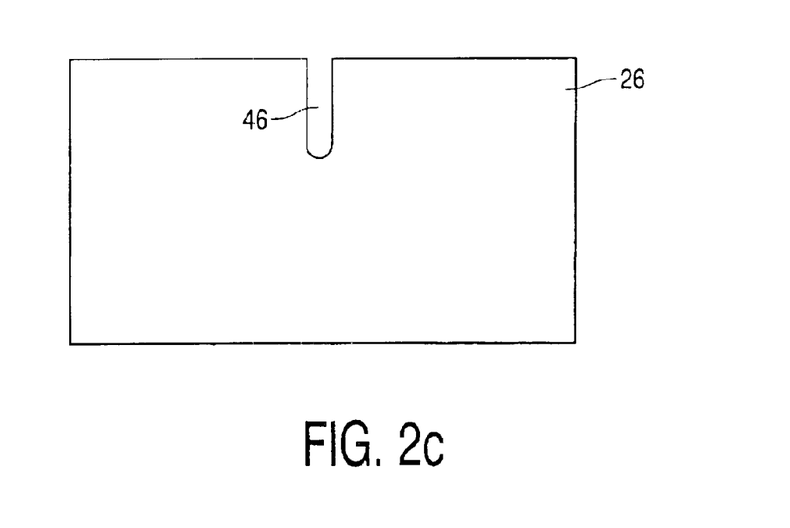
FIG. 2c is a plan view of a wedge-shaped displacement guide in accordance with the invention.

FIG. 2c is a plan view of one of the displacement guides, for example, the guide 26. This Figure shows the opening 46 for the passage of the laser beam of the distance sensor. It is to be noted that the use of the configuration in accordance with the invention makes it possible to utilize comparatively small openings, so that a displacement of the displacement member 32 in the y direction is possible by way of said fluid bearings, that is, without a y displacement of the guides 24 and 26 being required for this purpose. This is because this displacement component is realized by a y displacement of the displacement member 32. The latter member can be provided with a comparatively large opening 42 for the laser beam, without the supporting of this member by way of fluid bearings being impeded. This is because such bearing takes place on the wedge faces 34 and 36.

Figure 2D:
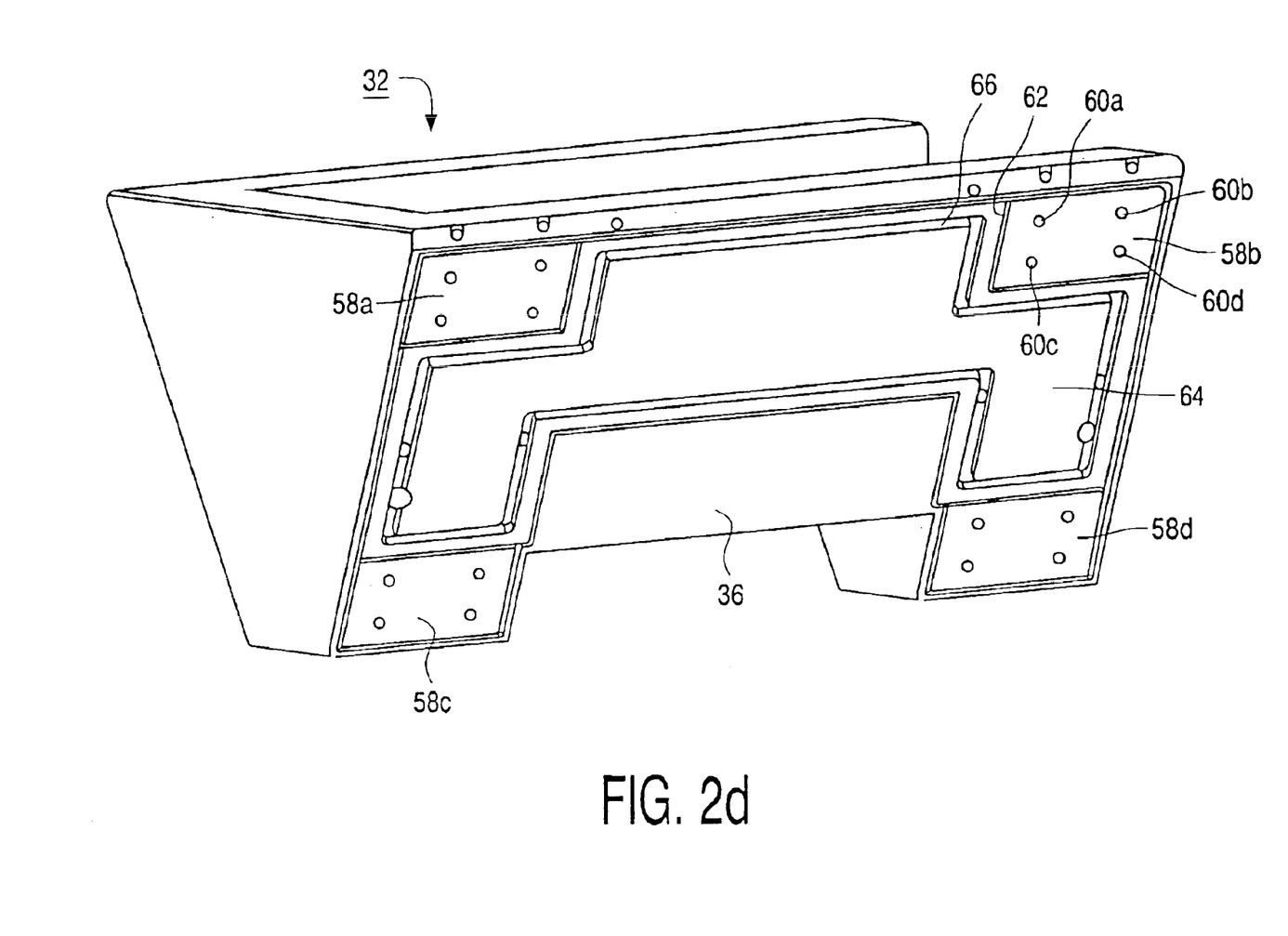
FIG. 2d is a perspective view of the displacement member in accordance with the invention.

FIG. 2d is a more detailed perspective view of the displacement member 32 in which the wedge face 36 with the elements for the fluid bearing on the corresponding wedge face 30 of the displacement guide 26 (FIG. 2a) are visible. The fluid bearing comprises four bearing areas 58a to 58d, each of which is provided with a number of feed holes 60a to 60d for feeding the fluid (for example air) under pressure to the bearing gap. The surface of the bearing area is defined by a groove (for example, 62) around this area. Furthermore, the wedge face 36 is provided with a preload area 64 in which an underpressure is created via outlet holes which are provided in a groove 66 extending around the preload area 64. The surface of the preload area 64 is defined in known manner by the combination of the grooves 62, the groove 66 and the intermediate area. The forces acting on the wedge face 36 due to the fluid bearing (that is, four forces exerted in the direction towards the wedge face by the four bearing areas 58 and one force exerted in the direction away from the wedge face by the preload area 64) will generally cause a turning moment on the displacement member 32; such a turning moment has an adverse effect on the precision of the positioning of this member. Because of the symmetrical wedge shape of this member, the advantage is achieved that such moments cancel one another.

Figure 2E:
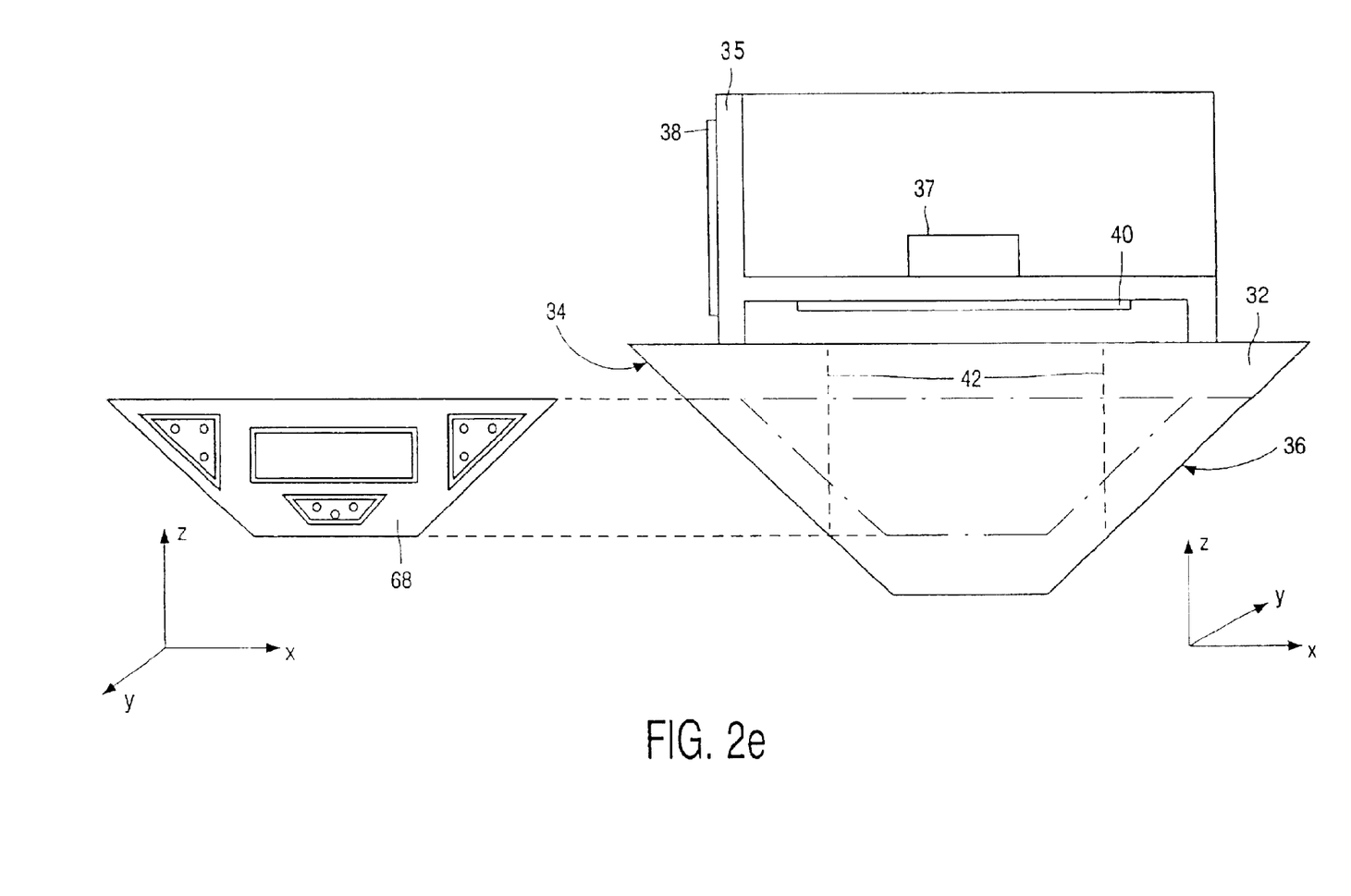
FIG. 2e is a diagrammatic representation of the fluid bearing for the y drive.

FIG. 2e is a diagrammatic representation of the fluid bearing for the y drive of the displacement member 32. The right-hand part of this Figure is a view in the same direction as in FIG. 2a, that is, a front face of the displacement member 32 with the wedge faces 34 and 36 extending perpendicularly to the plane of drawing. The left-hand part of FIG. 2 shows a surface 68 which co-operates with said front face and is provided with the elements necessary for a fluid bearing. Such a fluid bearing has already been described with reference to FIG. 2d and need not be further elaborated. The surface 68 forms part of a drive member 70 which contacts the displacement member 32 (see FIGS. 3a, 3b) in order to drive the y displacement, so a displacement in a direction perpendicular to the plane of drawing. The contour of the surface 68 is shown in the front face of the displacement member 32, that is, in a central position. The displacement member 32 can be displaced in the x direction as well as in the y direction; this motion should not be impeded by the drive member for the y direction. This desired effect is achieved in that the contact between the front face of the displacement member 32 and the drive member 70 is realized via the fluid bearing.

Figure 3A:
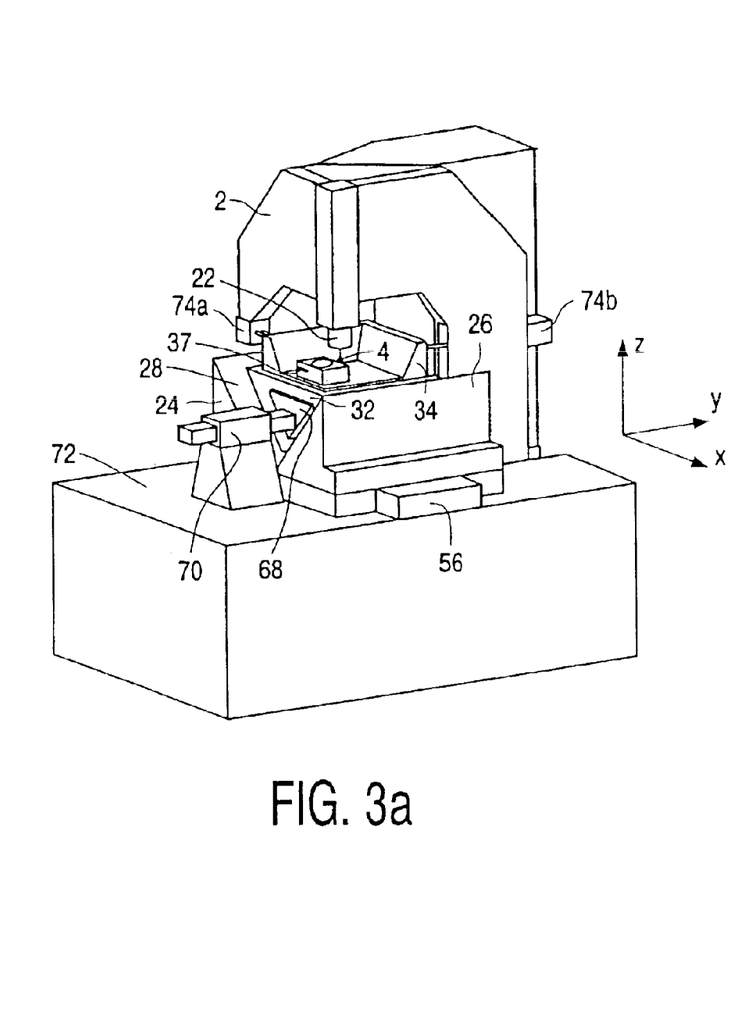
FIG. 3a is a first perspective view of the apparatus in accordance with the invention.
Figure 3B:
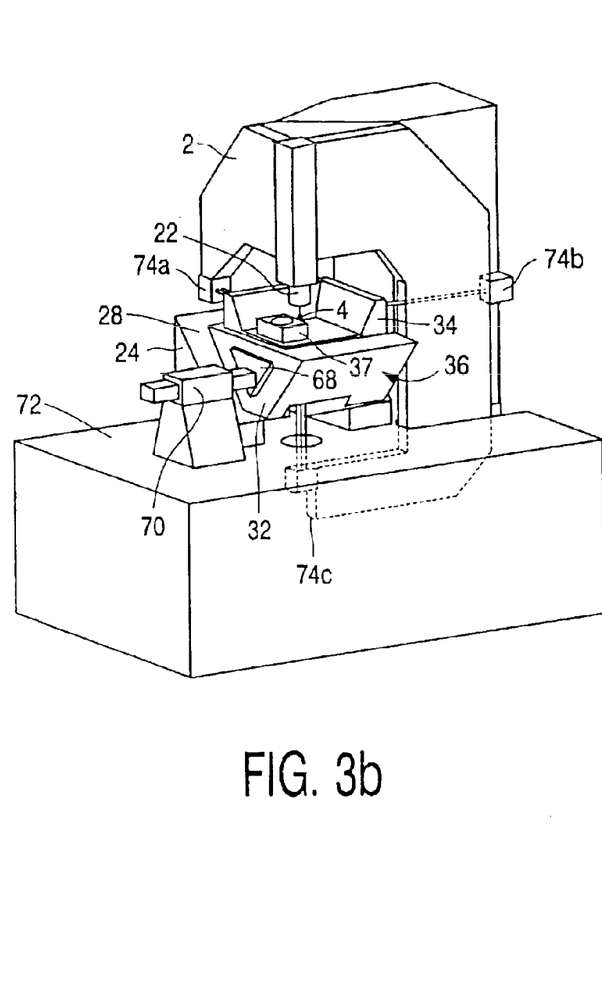
FIG. 3b is a second perspective view of the apparatus in accordance with the invention.

FIG. 3 consists of the FIGS. 3a and 3b. FIG. 3a is a first perspective view of the apparatus in accordance with the invention. FIG. 3b is a second perspective view of the apparatus in accordance with the invention, in which a number of elements has been omitted (that is, in comparison with FIG. 3a) in order to afford a better view of the laser distance sensor. FIG. 3 shows the drive member 70 for driving the y displacement of the displacement member 32. Also shown is the displacement stage 48 which is formed by the combination of the displacement guides 24 and 26 and the displacement member 32. This assembly is arranged on a rigid supporting frame 72. The system for laser distance measurement also forms part of the apparatus shown. This system comprises the three mirrors already described with reference to FIG. 2a, each of said mirrors being situated in a respective co-ordinate plane on the outside of the object carrier 35. With each of the mirrors there is associated a respective source of laser light 74a, 74b and 74c. These sources may be separate lasers, but may also be formed by a single laser wherefrom the laser light is conducted to each of the mirrors, for example, via optical fibers. With the aid of such laser sources and mirrors there is formed a laser distance sensor which operates on the basis of the known interference principle for accurate determination of the position of the object carrier. The signal derived from the laser distance sensor is applied to the computer 54 which controls the drive means on the basis of this signal in such a manner that the drive member reaches the desired position.

What is claimed is:

1. An apparatus for the measurement or machining of an object (37), which apparatus is provided with a displacement stage (48) for the displacement in at least one co-ordinate direction of a part of the apparatus (32, 34) which is to be displaced relative to a frame (2) of the apparatus, which displacement stage includes:

two supporting wedge-shaped displacement guides (24, 26) which bear on a supporting surface (20) of the apparatus and each of which is provided with a wedge face (28, 30), said guides being arranged opposite one another in such a manner that their wedge faces face one another, a displacement member (32) which is connected to the part of the apparatus to be displaced and is provided with two wedge faces (34, 36) which co-operate with the wedge faces (28, 30) of the displacement guides, the displacement member being supported by the wedge faces of the displacement guides as a result of said co-operation, which apparatus is also provided with drive means for the displacement of the two displacement guides in such a manner that the distance between their wedge faces varies while the orientation of the wedge faces relative to one another remains the same, characterized in that the apparatus is provided with control means for controlling the drive means, and that the drive means and the control means are arranged for mutually independent displacement of the two displacement guides.

2. An apparatus as claimed in claim 1, in which the wedge faces of the displacement member bear on the wedge faces of the displacement guides by way of fluid bearings.

3. An apparatus as claimed in claim 1, in which the displacement guides bear on the supporting surface of the apparatus by way of fluid bearings.

4. An apparatus as claimed in claim 1, in which the displacement guides (24, 26) are displaceable across the supporting surface (20) of the apparatus along linear guides (56) which are provided on the supporting surface, the displacement guides bearing on the linear guides by way of fluid bearings.

5. An apparatus as claimed in claim 1, in which
the displacement member (32) is displaceable, relative to the displacement guides (24, 26), in the direction of the line of intersection of its wedge faces,
the apparatus is provided with a drive member (70) which contacts the displacement member in order to drive said displacement, and
the contact between the displacement member (32) and the drive member (70) is realized by way of a fluid bearing.

6. An apparatus as claimed in claim 1, in which the part of the apparatus to be displaced (32, 34) is provided with at least one mirror surface (38) and in which the displacement in at least one co-ordinate direction is measured by means of a laser distance sensor (74, 38, 40) which comprises said mirror surface.

7. A displacement stage for an apparatus for the measurement or machining of an object comprising:

two supporting wedge-shaped displacement guides (24, 26) which bear on a supporting surface (20) of the apparatus and each of which is provided with a wedge face (28, 30), said guides being arranged opposite one another in such a manner that their wedge faces face one another, a displacement member (32) which is connected to the part of the apparatus to be displaced and is provided with two wedge faces (34, 36) which co-operate with the wedge faces (28, 30) of the displacement guides, the displacement member being supported by the wedge faces of the displacement guides as a result of said co-operation, the apparatus being provided with drive means for the displacement of the two displacement guides in such a manner that the distance between their wedge faces varies while the orientation of the wedge faces relative to one another remains the same, the apparatus being provided with control means for controlling the drive means, and the drive means and the control means being arranged for mutually independent displacement of the two displacement guides.

* * * * *